United States Patent [19]
Gardner et al.

[11] Patent Number: 6,004,861
[45] Date of Patent: Dec. 21, 1999

[54] PROCESS FOR MAKING A DISCONTINUOUS SOURCE/DRAIN FORMATION FOR A HIGH DENSITY INTEGRATED CIRCUIT

[75] Inventors: Mark I. Gardner, Cedar Creek; Mark C. Gilmer, Austin, both of Tex.

[73] Assignee: Advanced Micro Devices, Sunnyvale, Calif.

[21] Appl. No.: 08/994,814

[22] Filed: Dec. 19, 1997

[51] Int. Cl.⁶ .......................... H01L 21/28; H01L 21/336
[52] U.S. Cl. .......................... 438/414; 438/296; 438/637; 438/675; 257/365
[58] Field of Search .................... 438/296, 414, 438/637, 639, 672, 674, 675, 453; 257/365

[56] References Cited

U.S. PATENT DOCUMENTS

| | | | |
|---|---|---|---|
| 5,567,650 | 10/1996 | Straight et al. | 438/672 |
| 5,705,427 | 1/1998 | Chan et al. | 438/672 |
| 5,719,089 | 2/1998 | Cherng et al. | 438/637 |
| 5,723,381 | 3/1998 | Grewal et al. | 438/639 |
| 5,731,242 | 3/1998 | Parat et al. | 438/637 |
| 5,763,309 | 6/1998 | Chang | 438/296 |
| 5,780,339 | 7/1998 | Liu et al. | 438/675 |
| 5,807,779 | 9/1998 | Liaw | 438/637 |
| 5,869,403 | 2/1999 | Becker et al. | 438/637 |
| 5,874,353 | 2/1999 | Lin et al. | 438/296 |
| 5,880,020 | 3/1999 | Mano | 438/637 |
| 5,929,492 | 7/1999 | Okamura | 257/365 |

*Primary Examiner*—Charles Bowers
*Assistant Examiner*—David S Blum
*Attorney, Agent, or Firm*—Joseph Lally; Raman Dewan; Dewan & Lally, L.L.P.

[57] ABSTRACT

A semiconductor process including forming a gate dielectric on a semiconductor substrate. First and second conductive gates are then formed on the gate dielectric. The conductive gates are aligned over respective channel regions of the substrate. The channel regions are laterally displaced between respective pairs of source/drain regions. A first interlevel dielectric is then deposited on the substrate and source/drain vias are then formed in the interlevel dielectric. The source/drain vias terminate on the pairs of source/drain regions. Thereafter, a source/drain impurity is introduced into the source/drain regions to form source/drain structures. A conductivity type of the source/drain structures is opposite a conductivity type of the field region. The first interlevel dielectric substantially prevents the source/drain impurity from entering the field region of the semiconductor substrate. In this manner, adjacent source/drain regions displaced on either side of the field region 106 are isolated from one another.

13 Claims, 3 Drawing Sheets

PROCESS FOR MAKING A DISCONTINUOUS SOURCE/DRAIN FORMATION FOR A HIGH DENSITY INTEGRATED CIRCUIT

BACKGROUND OF THE INVENTION

1. Field of the Invention

The present invention relates to the field of semiconductor fabrication and more particularly to method of increasing circuit density by providing a discontinuous source/drain structure.

2. Description of the Relevant Art

In the conventional fabrication of an MOS integrated circuit, a silicon wafer is divided into a plurality of active regions and field regions typically through the use of a selective oxidation or trench formation process during which dielectric isolation structures are fabricated into the field regions of the substrate to provide physical and electrical isolation between adjacent, subsequently formed transistors comprising the integrated circuit. In this manner, the semiconductor substrate is essentially divided into active regions and field regions. The field regions in the conventional process flow are characterized by an isolation dielectric structure fabricated into the upper surface of the silicon substrate. The presence of these dielectric isolation structures is required in the conventional integrated circuit process to prevent a conductive path from being formed between each active area of the transistor during a subsequent source/drain implant. Typically, a source/drain implant in a conventional semiconductor process is performed across the entire surface of the substrate. The presence of patterned polysilicon gate structures on the wafer during the source/drain implant results in the formation of MOS transistors. But for the presence of the isolation structures, however, each of the source/drain regions created by the source/drain implant would be electrically coupled.

Dielectric isolation structures are typically fabricated with a LOCOS process or with shallow trench isolation structures. In a LOCOS process, the field regions of the silicon substrate are thermally oxidized by patterning a silicon nitride layer over the active regions of the substrate, and thereafter, thermally oxidizing the exposed portions of the substrate to create relatively thick dielectric structures over the field regions of the wafer. In addition to requiring a photolithography step, LOCOS processing typically requires the deposition of a pad oxide layer prior to the deposition of a silicon nitride layer and further requires a rather extensive thermal oxidation step to produce an oxide thickness necessary to isolate adjacent structures. Similarly, a shallow trench isolation process requires a photolithography step and additional processing including a silicon etch step, an oxide deposition step, a planarization step, and possibly a thermal oxidation process to form a thermal oxide liner over the sidewalls and floor of the trench. Thus, it will be appreciated that the formation of adequate isolation structures in a typical semiconductor fabrication process can be an expensive, time consuming, and complicated process during which random defects in the form of particles may be generated possibly resulting in a decrease in the yield of the semiconductor process. In addition, the physical dimensions of the isolation structures places a lower limit on the density with which transistors may be fabricated on the substrate. In a LOCOS process, for example, it is well known that the thermal oxidation process that produces the field oxide structure is characterized by a bird's beak structure that laterally encroaches upon the active regions of the silicon substrate thereby increasing the minimum spacing between adjacent transistors. Shallow trench isolation dielectric structures also tend to result in some consumption of the active regions at the boundaries between the isolation regions and the active regions of the wafer. The surface area of the silicon substrate consumed by these isolation structures would be more desirably utilized as an active region of the circuit. Increased circuit density is desirable from a manufacturing perspective because of the increased number of devices that may be fabricated upon a single silicon wafer. In addition, smaller integrated circuits are less likely to be rendered non-functional by a randomly generated particle defect. In other words, smaller devices result in a larger number of devices available on a single wafer and in a higher manufacturing yield. Thus, it would be desirable to implement an MOS fabrication process that increased circuit density.

In addition to the density concerns described, conventional silicon fabrication processes typically result in source/drain interconnect structures that have a relatively high sheet resistivity. Typically, the source/drain regions of selected transistors are coupled to one another through a source/drain interconnect that is formed simultaneously with the formation of the transistor source/drain regions. Because these source/drain interconnects comprise doped silicon, their resistivity is typically higher than the resistivity associated with other well known materials used for interconnect structures in semiconductor fabrication process including, among others, aluminum, copper, and tungsten. The higher resistivity associated with source/drain interconnects may, in some circumstances, require the circuit designer to increase the physical dimensions of a source/drain interconnect to achieve a desired sheet resistivity. Under such circumstances, the larger physical dimensions imposed by the higher resistivity source/drain structure, may result in an additional reduction in the maximum circuit density attainable. Accordingly, it will be further desired to implement a semiconductor fabrication process in which the sheet resistivity of source/drain interconnects is less than the sheet resistivity of the heavily doped source/drain structures.

SUMMARY OF THE INVENTION

The problems identified above are in large part addressed by a semiconductor fabrication process in which a discontinuous source/drain region is provided by implementing source/drain interconnects with a relatively highly conductive interconnect material above the upper surface of the silicon substrate. By displacing the source/drain interconnect layer to a plane displaced above the silicon substrate and implementing the interconnect structures with a relatively highly conductive material, it is theorized that the density with which the integrated circuit transistors may be fabricated will be increased. In addition, it is theorized that, in one embodiment, the circuit density may further be increased by eliminating the dielectric isolation structures entirely. In this embodiment, the isolation of adjacent transistors is achieved by selectively introducing the source/drain implant only into the source/drain regions adjacent to the channel regions of the integrated circuit transistors. A selective introduction of the source/drain implant is achieved by patterning an interlevel dielectric structure over the silicon substrate prior to the source/drain implant and, thereafter, forming source/drain vias in the interlevel dielectric prior to source/drain implant.

Broadly speaking, it is an object of the present invention to provide a semiconductor process in which a gate dielectric is formed on a semiconductor substrate. First and second conductive gates are then formed on the gate dielectric layer. The conductive gates are aligned over respective channel regions of the substrate. The channel regions are laterally displaced between respective pairs of source/drain regions. A first interlevel dielectric is then deposited on the semiconductor substrate. Source/drain vias are then formed in the interlevel dielectric. The source/drain vias terminate on the pairs of source/drain regions. Thereafter, a source/drain impurity is introduced into the source/drain regions to form source/drain structures. A conductivity type of the source/drain structures is opposite a conductivity type of the field regions. After the formation of the source/drain vias, the first interlevel dielectric serves as an implant mask substantially preventing the source/drain impurity from entering a portion of the substrate intermediate between source/drain regions of adjacent transistors. In this manner, the source/drain regions of adjacent transistors are isolated regardless of the presence or absence of a dielectric isolation structure intermediate between the adjacent source/drain structures. In one embodiment, spacer structures are formed on the sidewalls of the conductive gates prior to the deposition of the interlevel dielectric. Silicon nitride spacers are used in one presently preferred embodiment to achieve spacer structures that are selective to a subsequent oxide etch required to form the source/drain vias. In one embodiment, the process further includes filling the source/drain vias with a conductive material and planarizing the conductive material to form via plugs. In addition, a second interlevel dielectric layer may be deposited and thereafter etched to produce contact vias in the second interlevel dielectric where the contact vias terminate on the source/drain plugs and the conductive gates. The contact vias would then be filled with a conductive material and, thereafter, planarized to form contact structures suitable for coupling the conductive gates and the source/drain structures to a subsequently formed interconnect layer. In one embodiment, the formation of the gate dielectric is accomplished by thermally oxidizing the semiconductor substrate in an oxygen bearing ambient maintained at a temperature in the range of approximately 400 to 800° C. for a duration in the range of approximately 2 to 20 minutes. Preferably, the formation of the first and second conductive gates is accomplished with a polysilicon deposition process in which silane is thermally decomposed in a CVD reactor chamber maintained at a temperature in the range of approximately 580 to 650° C. and a pressure of less than approximately 2 torr. The deposited polysilicon layer is then patterned and etched with a photolithography/etch process. The deposition of the first interlevel dielectric is accomplished in a presently preferred embodiment by chemically vapor depositing a silicon-oxide compound at a temperature in the range of approximately 200 to 700° C. using a silane or TEOS source. The introduction of the source/drain impurity into the source/drain regions of the substrate is preferably accomplished with an ion implantation process using an implant species of boron, arsenic, or phosphorous and an implant dose in excess of approximately $1 \times 10^{14}$ atom/cm$^2$ and an implant energy in the range of approximately 20 to 200 keV.

It is a further object of the present invention to provide for an integrated circuit. The integrated circuit includes a semiconductor substrate, first and second conductive gates, and first and second pairs of source/drain structures. The semiconductor substrate includes first and second active regions laterally displaced on either side of a field region. Each of the active regions includes a channel region laterally displaced between respective pairs of source/drain regions. In one embodiment, the field region of the semiconductor substrate lacks a dielectric isolation structure and is comprised essentially of doped silicon. The first conductive gate is formed over a first portion of a gate dielectric and aligned over a first channel region of the substrate. The second conductive gate is formed over a second portion of the gate dielectric and is aligned over the second channel region. The first pair of source/drain structures includes a portion of a source/drain impurity distribution that is contained within a pair of source/drain regions laterally displaced on either side of the first channel region. The second pair of source/drain structures includes a portion of the source/drain impurity distribution contained within the pair of source/drain regions laterally displaced on either side of the second conductive gate and second channel region. The first and second pairs of source/drain structures share a common conductivity type. Each of the first and second pair of source/drain regions are isolated from each other by the field region, which has a conductivity type opposite the conductivity type of the first and second pairs of source/drain regions.

In one embodiment, a starting material used for the semiconductor substrate includes a single crystal silicon which has a lightly doped p-type region formed over a p+bulk region. A room temperature resistivity of the lightly doped region is in the range of approximately 10 to 25 Ω-cm. Preferably, the first and second conductive gates comprise doped polysilicon. In this embodiment, a sheet resistivity of the polysilicon is less than approximately 500 Ω/square. Preferably, the gate dielectric is comprised of thermally formed silicon dioxide. An impurity species of the source/drain impurity distribution, in a presently preferred embodiment, is boron, phosphorous, or arsenic. A peak impurity concentration of the source/drain structures in the preferred embodiment is in excess of approximately $1 \times 10^{19}$ atom/cm$^3$. In one embodiment, the field region of the semiconductor substrate consists essentially of lightly doped silicon having a peak impurity concentration of less than approximately $5 \times 10^{15}$ atom/cm$^3$.

It is a further objective of the present invention to provide a method of isolating adjacent source/drain structures of neighboring transistors in a semiconductor fabrication process. The method includes forming a gate dielectric on a semiconductor substrate, forming first and second conductive gates, depositing a first interlevel dielectric, and forming source/drain vias in the interlevel dielectric. The formation of the first and second conductive gates is accomplished wherein the conductive gates are aligned over respective channel regions of the semiconductor substrate. The channel regions are laterally displaced between respective pairs of source/drain region. A field region of the semiconductor substrate is displaced between a source/drain region of the first conductive gate and an adjacent source/drain region of the second conductive gate. In this manner, the field region consists essentially of doped silicon in the preferred embodiment. A first interlevel dielectric is then deposited on the substrate and source/drain vias are formed in the interlevel dielectric. The source/drain vias terminate on the pairs of source/drain regions. Thereafter, a source/drain impurity is introduced into the source/drain regions to form pairs of source/drain structures. A conductivity type of the pairs of source/drain structures is opposite a conductivity type of the field region whereby the source/drain structures associated with the first conductive gate are isolated from an adjacent source/drain region associated with the second conductive gate. Preferably, a resistivity of the doped silicon within the field region is in the range of approximately 10 to 25 Ω-cm. In one embodiment, the process further includes the formation of spacer structures on the sidewalls of the conductive gate.

BRIEF DESCRIPTION OF THE DRAWINGS

Other objects and advantages of the invention will become apparent upon reading the following detailed description and upon reference to the accompanying drawings in which.

Figure 1:
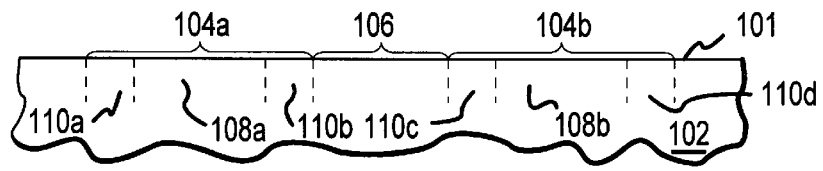
FIG. 1 is a partial cross-sectional view of a semiconductor substrate including a pair of active regions laterally displaced on either side of a field region.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Turning now to the drawings, FIGS. 1–11 depict a presently preferred embodiment of a processing sequence useful in improving the maximum obtainable transistor density in an integrated circuit by altering the source/drain formation sequence such that the source/drain conductors are vertically displaced above the semiconductor substrate. By eliminating the source/drain conductors and interconnects from the semiconductor substrate, it is theorized that the minimum dimension between adjacent transistors may be reduced relative to conventional integrated circuit fabrication processes in which the source/drain impurity distribution is introduced into the semiconductor substrate everywhere where there is not an isolation structure or a conductive gate structure.

Turning now to FIG. 1, semiconductor substrate 102 is shown including first region 104a and a second active region 104b (collectively referred to as active regions 104) laterally displaced on either side of a field region 106. Each active region 104 includes a channel region 108 laterally displaced between a pair of source/drain regions 110. Preferably, semiconductor substrate 102 comprises a single crystal silicon wafer well known in the field of semiconductor processing. Preferably, the silicon wafer of the preferred embodiment includes a lightly doped p-type layer formed over a heavily doped p-type region. (In the partial cross-sectional views shown in FIGS. 1–11, only the lightly doped layer of semiconductor substrate 102 is explicitly shown). Preferably, a resistivity of the p-type lightly doped region is in the range of approximately 10 to 25 Ω-cm and a peak impurity concentration within the heavily doped p-type layer is in excess of approximately $1 \times 10^{19}$ atom/cm$^3$. In one embodiment, for example, the lightly doped upper layer of semiconductor substrate 102 comprises an epitaxial layer formed over a heavily doped p+silicon bulk. The heavily doped bulk of the silicon substrate is useful in providing improved immunity to latchup condition associated with CMOS integrated circuits while the lightly doped upper region suitable for fabrication of high performance deep sub-micron transistors.

Typically, the field region 106 of a semiconductor substrate comprises a region of the substrate dedicated to the fabrication of an isolation dielectric structure such as a LOCOS field oxide structure or a shallow trench isolation structure. One embodiment of the present invention contemplates the minimization or elimination of such dielectric isolation structures from the integrated circuit by controlling the regions within semiconductor substrate 102 into which the source/drain impurity distribution is introduced. Thus, in such an embodiment, field region 106 lacks a dielectric isolation structure and consists essentially of a doped silicon lattice.

Figure 2:
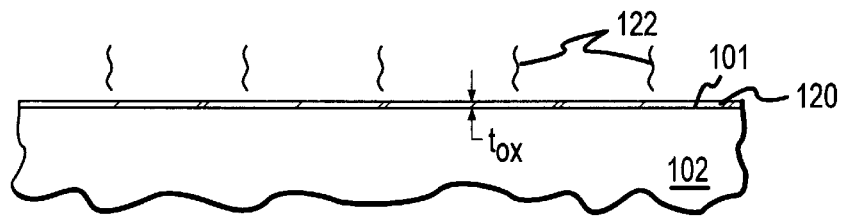
FIG. 2 is a processing step subsequent to FIG. 1 in which a gate dielectric film is formed on an upper surface of the semiconductor substrate.

Turning now to FIG. 2, a gate dielectric layer 120 is formed over the upper surface 101 of semiconductor 102. In the preferred embodiment, the formation of gate dielectric structure 120 is accomplished with a thermal oxidation process represented in FIG. 2 by reference numeral 122. Preferably, thermal oxidation process 122 includes immersing semiconductor substrate 102 into an oxygen bearing ambient maintained at a temperature in the range of approximately 400 to 800° C. for a duration in the range of approximately 2 to 20 minutes. The oxygen bearing ambient used for thermal oxidation process 122, in the preferred embodiment, comprises a dry $O_2$ ambient into which a chlorine bearing species is introduced to produce high quality thermal oxides. Preferably, a thickness $t_{OX}$ of gate dielectric 120 is in the range of approximately 10 to 75 angstroms.

Figure 3:
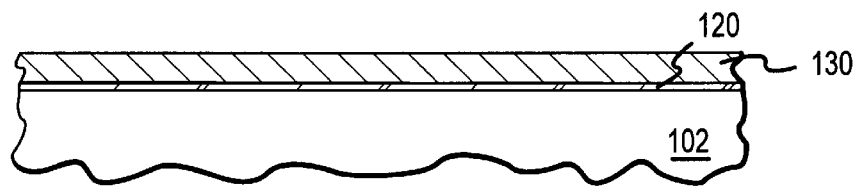
FIG. 3 is a processing step subsequent to FIG. 2 in which a conductive gate layer is formed over the gate dielectric layer.

Turning now to FIG. 3, a conductive gate layer 130 is formed over gate dielectric layer 120. In the preferred embodiment, the formation of conductive gate layer 130 is accomplished by depositing polysilicon. Preferably, the deposition of the polysilicon is achieved by thermally decomposing silane in a chemical vapor deposition reactor chamber maintained at a temperature in the range of approximately 580 to 650° C. and a pressure of less than approximately 2 torr. A sheet resistivity of the as-deposited polysilicon layer 130 is typically reduced by introducing an impurity concentration into the polysilicon preferably through the use of an ion implantation process (not specifically shown in FIG. 3) in which a sufficient impurity distribution is introduced to reduce a sheet resistivity of conductive gate layer to less than approximately 500 Ω/square. A suitable thickness for conductive gate layer 130 in the preferred embodiment is in the range of approximately 500 to 1,000 angstroms. It will be appreciated that other suitable conductive materials may be used for conductive gate layer 130. Such materials may include, for example, aluminum, copper, tungsten, or other suitable conductive material.

Figure 4:
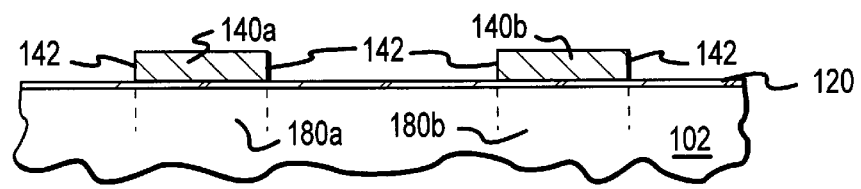
FIG. 4 is a processing step subsequent to FIG. 3 in which first and second conductive gates are formed from the conductive gate layer aligned over respective channel regions of the substrate.

Turning now to FIG. 4, the conductive gate layer 130 of FIG. 3 has been patterned to produce first and second conductive gates 140a and 140b respectively. Each of the conductive gates 140 is aligned over a respective channel region 108 of semiconductor substrate 102. The patterning of the conductive gate layer to produce the conductive gates is accomplished with a conventional photolithography and etch sequence. Preferably, a plasma etch is used to produce conductive gates that include substantially vertical sidewalls represented in FIG. 4 by reference numeral 142. Those familiar with semiconductor fabrication processes will appreciate that the boundaries of the channel region 108 are actually defined by the positions of the sidewalls 142 of the conductive gates 140 such that the conductive gates are said to be self aligned to the channel region 108 resulting in essentially zero overlap or misalignment between the conductive gate 140 and the underlying channel region 108.

Figure 5:
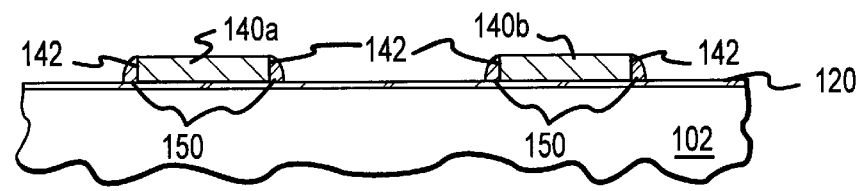
FIG. 5 is a processing step subsequent to FIG. 4 in which spacer structures are formed on sidewalls of the conductive gates.

Turning now to FIG. 5, an optional process step is shown in which spacer structures 150 are fabricated on the sidewalls 142 of the conductive gates 140. In this embodiment, the formation or creation of the spacer structures 150 is suitably accomplished by a thin film deposition process such as a low pressure chemical vapor deposition process to deposit a substantially conformal film over the topography comprising the gate dielectric 120 and the conductive gates 140. (For purposes of this disclosure, a conformal film refers to a film in which the film thickness varies less than approximately 20% across the underlying topography.) In the preferred embodiment, the conformal film is comprised of a dielectric material such as a silicon-oxide compound or a silicon nitride. A suitable silicon-oxide conformal film may be fabricated by a CVD process using a TEOS or silane source. A suitable silicon nitride deposition process may include thermally decomposing silane and ammonium in a CVD reactor chamber maintained at a temperature in the range of approximately 200 to 800° C. with a pressure of less than approximately 2 torr. Subsequent to the formation of the conformal dielectric film, a plasma etch process is utilized to remove the conformal film from the substantially horizontal regions of the topography as will be appreciated to those skilled in the art of anisotropic etch processes.

Figure 6:
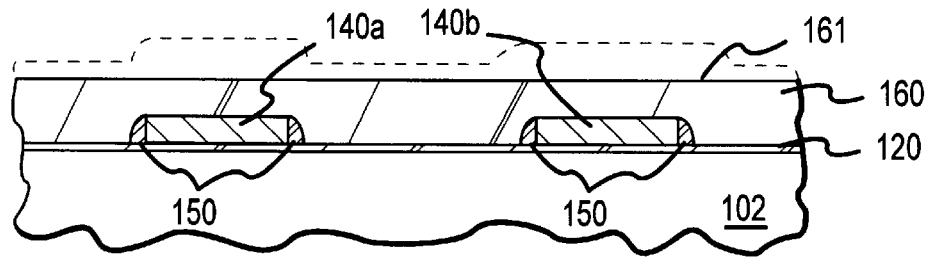
FIG. 6 is a processing step subsequent to FIG. 5 in which an interlevel dielectric is deposited over the wafer and planarized.

Turning now to FIG. 6, a first interlevel dielectric layer 160 is deposited over the underlying topography of the substrate 102. The preferred composition of interlevel dielectric 160 should be such that a subsequent etch process can be performed selectively with respect to spacer structures 150 and conductive gates 140. In an embodiment, for example, in which conductive gates 140 comprise polysilicon and spacer structures 150 are comprised of silicon nitride, a suitable composition of interlevel dielectric 160 includes a chemically vapor deposited silicon dioxide. In an embodiment in which spacer structures 150 comprise CVD silicon dioxide, interlevel dielectric 160 may comprise silicon nitride. After the deposition of first interlevel dielectric 160, a planarization process is typically performed to remove elevational disparities in the deposited film. Portions of first interlevel dielectric 160 removed during this planarization process are shown in phantom in FIG. 6. A suitable planarization process may include a chemical mechanical polish, a resist/etchback process, or a combination thereof The planarization process is designed to produce a substantially planar upper surface 161 of first interlevel dielectric 160. The deposition of a dielectric film 160 immediately after the formation of conductive gate structures (with or without associated spacer structures) is contrasted to a conventional semiconductor fabrication process in which a source/drain implant is typically performed after the formation of the transistor gates. The blanket deposition of interlevel dielectric layer 160 over substrate 102 prior to the source/drain implant provides a mechanism by which the subsequent implant may be introduced selectively into desired regions of the substrate.

Figure 7:
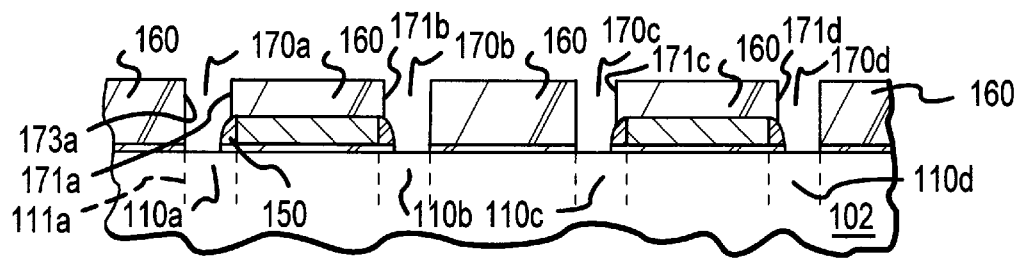
FIG. 7 is a processing step subsequent to FIG. 6 in which source/drain vias are formed in the interlevel dielectric such that the source/drain vias are aligned over source/drain regions of the substrate.

Turning now to FIG. 7, a plurality of source/drain vias 170 are etched into interlevel dielectric 160. Each of the source/drain vias terminates on a corresponding source/drain region 110. In the preferred embodiment, the source/drain vias are fabricated with a plasma etch process selective to the material comprising spacer structures 150. Preferably, an interior sidewall 171 of each corresponding source/drain via 170 is aligned over a corresponding spacer structure 150 such that the interior sidewall 171 terminates on the associated spacer structure. The opposing sidewall 173 is aligned over exterior boundary 111a of source/drain region. It will be appreciated to those familiar with self-aligned processes that the actual position of exterior boundary 111 of source/drain region 110 is defined by the position of opposing sidewall 173 of source/drain via 170. In this manner, the source/drain regions 110 of substrate 102 are self-aligned to the source/drain vias 170. This self-alignment is contrasted to a conventional semiconductor fabrication process in which the contacts to the source/drain regions are formed with a dedicated contact mask step. The misalignment associated with this dedicated mask step requires that the source/drain regions in a conventional fabrication process be of a dimension sufficient to accommodate any misalignment in the contact mask step. In contrast, the present invention, by self-aligning the source/drain vias to the underlying source/drain regions results in essentially zero misalignment. Accordingly, the dimensions of the source/drain regions in the present invention may be reduced relative to the source/drain dimensions in the conventional process resulting in a potential reduction in the total silicon area required to fabricate transistors with the present invention.

Figure 8:
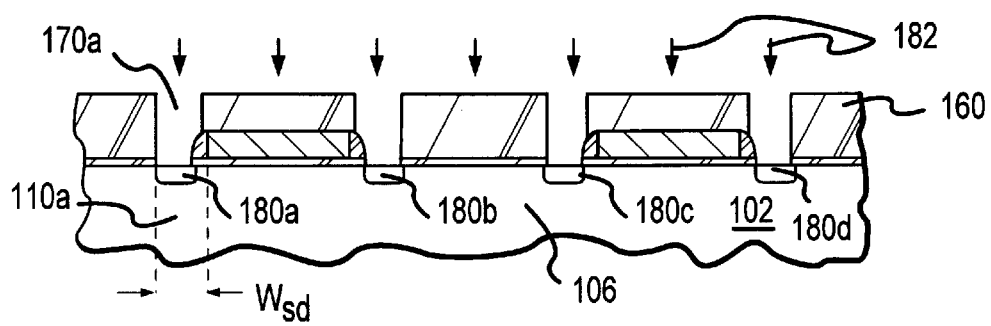
FIG. 8 is a processing step subsequent to FIG. 7 in which a source/drain impurity distribution is introduced into the source/drain regions of the substrate.

Turning now to FIG. 8, a source/drain impurity distribution 180 is introduced into the corresponding source/drain regions 110 of semiconductor substrate 102, preferably through the use of an ion implantation process represented in FIG. 8 by reference numeral 182. In the preferred process, an implant species used for ion implantation process 182 includes phosphorous, arsenic, or boron. A suitable dose for use in conjunction with ion implantation process 182 is, in the preferred embodiment, in excess of approximately $1 \times 10^{14}$ atom/cm$^2$ while an implant energy is preferably in the range of approximately 20 to 200 keV. It will be appreciated that each of the source/drain structures 180 is self-aligned to corresponding source/drain via 170 thereby resulting, as described previously, in essentially no misalignment between the lateral positions of the source/drain structures 180 and the source/drain vias 170 thereby facilitating a reduction in the minimum width $w_{sd}$ of source/drain region 110. It will be appreciated that the selective introduction of the source/drain impurity into the semiconductor substrate through the use of a first interlevel dielectric 160 into which source/drain vias 170 have been fabricated substantially prevents the source/drain impurity from entering the channel regions 106 of semiconductor substrate 102 laterally displaced between adjacent source/drain regions 180b and 180c. It will be further appreciated that a conductivity type of the source/drain regions 180 is opposite a conductivity type field region 106. Thus, the present invention contemplates that adjacent source/drain regions 180b and 180c are isolated from one another by back-to-back p-n junctions. Accordingly, one embodiment of the present invention contemplates isolating adjacent source/drain regions 180b and 180c from one another without the presence of an isolation dielectric within the field region 106 between the adjacent source/drain regions. In this embodiment, the field region 106 lacks an isolation dielectric and consists essentially of doped silicon. In this embodiment, it is theorized that the elimination of conventional isolation dielectric structures from the semiconductor substrate may enable the fabrication of integrated circuits with increased transistor density due to the elimination of the need to dedicate a portion of the semiconductor substrate to the isolation structures themselves. With a LOCOS process, for example, a portion of the semiconductor substrate must be dedicated to the inevitable formation of the laterally formed bird's beak structure characteristic of the LOCOS process. Similarly, in a shallow trench isolation process in which a thermal oxide liner is produced prior to filling of the isolation trench, a thermal oxidation process used to produce a trench liner consumes a portion of the adjacent active regions of the substrate. By eliminating the isolation structures entirely, one embodiment of the present invention contemplates the elimination of the need to dedicate portions of the semiconductor substrate to these laterally formed structures inherent in conventional isolation processes.

Figure 9:
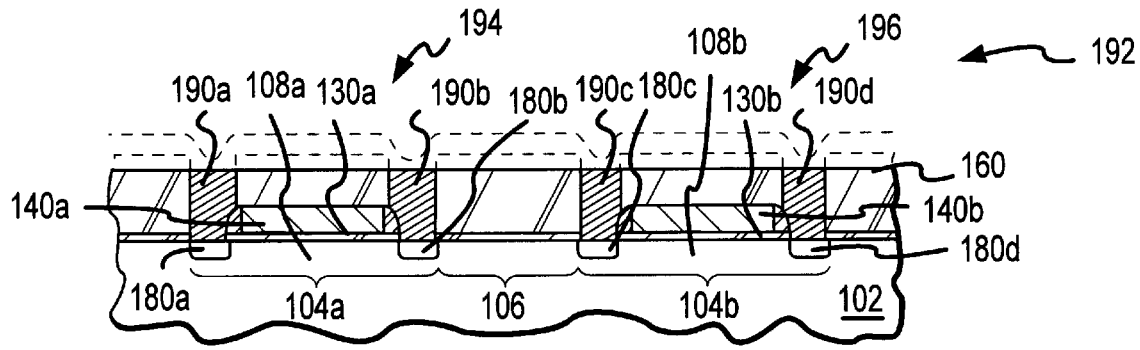
FIG. 9 is a processing step subsequent to FIG. 8 in which the contact vias are filled with a conductive material and subsequently planarized to produce via plugs.

Turning now to FIG. 9, source/drain vias 170 are filled with a conductive material to produce source/drain plugs 190. In an embodiment useful in conjunction with via structures that may have an aspect ratio of greater than 1, a suitable process for forming the source/drain plugs 190 comprises a tungsten chemical vapor deposition process possibly preceded by the deposition of an inhesion layer along the sidewalls of the vias 170 as will be appreciated to those familiar with tungsten deposition processes. In other embodiments, the source/drain plugs 190 may comprise, for example, aluminum, copper, heavily doped silicon, or other suitable conductive material. A suitable planarization process is preferably performed to remove portions of the deposited material from regions exterior to the source/drain vias 170. The planarization process may result in the removal of a portion of the first interlevel dielectric 160. Resulting in the formation of a substantially planar surface. Portions of the deposited conductive material and the first isolation dielectric 160 removed during the described planarization process are shown in phantom in FIG. 9. Thus, FIG. 9 depicts an integrated circuit 192 including a first transistor 194 and a second transistor 196. The integrated circuit 192 includes semiconductor substrate 102, which includes, as described with respect to FIG. 1, first and second active regions 104a and 104b laterally displaced on either side of a field region 106. Each of the active regions further includes a pair of source/drain regions 110 (shown as in FIG. 1) laterally displaced on either side of respective channel region 108. First transistor 104 includes a first conductive gate 140a formed on a first portion of a gate dielectric 140. First transistor 194 further includes a first pair of source/drain structures 180a and 180b substantially contained within a pair of source/drain regions 110 laterally displaced on either side of first conductive gate 140. The source/drain structures have a common conductivity type. Similarly, second transistor 196 includes a second conductive gate 140b formed over a second portion 130b of gate dielectric 130. Second conductive gate 140b is aligned over channel region 108b. Second transistor 196 further includes a second pair 180c and 180d of source/drain structures contained within a second pair 110c and 110d (as shown in FIG. 1) of source/drain regions of semiconductor substrate 102. A conductivity type of the pairs of source/drain structures is common. Adjacent source/drain structures 180b and 180c, associated with first transistor 194 and second transistor 196 respectively, are isolated by the opposite conductivity type of the field region 106 placed between the source/drain region. Thus, in one embodiment, the field region 106 of integrated circuit 192 lacks a dielectric isolation structure and consists essentially of doped silicon. A peak impurity concentration within the source/drain structures 180 is preferably in excess of approximately $1 \times 10^{19}$ atom/cm$^3$. In the preferred embodiment, the peak impurity concentration with field region 106 of substrate 102 is less than approximately $5 \times 10^{15}$ atom/cm$^3$.

Figure 10:
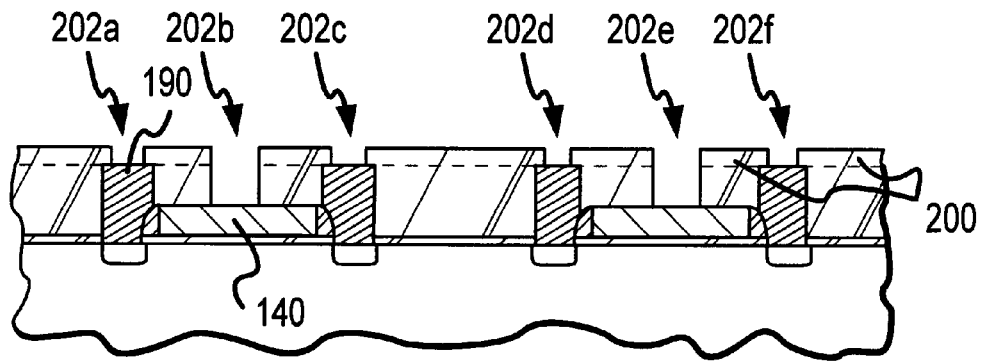
FIG. 10 is a processing step subsequent to FIG. 9 in which a second interlevel dielectric is deposited and, thereafter, contact vias are etched into the second interlevel dielectric such that the contact vias terminate on the via plugs and the conductive gates.
Figure 11:
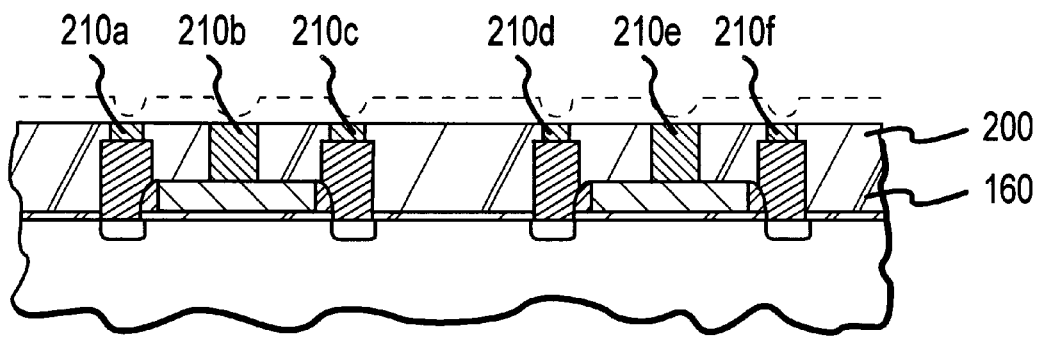
FIG. 11 is a processing step subsequent to FIG. 10 in which the contact vias are filled with a conductive material followed by a planarization step to form contacts to the source/drain plugs in the conductive gates.

Turning now to FIG. 10, a second interlevel dielectric is deposited on the topography shown with respect to FIG. 9 and thereafter selectively etched to form contact vias 202 which terminate on the source/drain plugs 190 as well as the conductive gates 140. Preferably, the deposition of the second interlevel dielectric 200 is carried out in a manner similar to the deposition of first interlevel dielectric 160. Similarly, the process used to form the contact vias 202 is preferably similar to the process used to fabricate source/drain vias 170. The deposition/formation process used to produce the partial cross-sectional view shown in FIG. 10 may further include a planarization process such as a chemical mechanical polish. Turning now to FIG. 11, the contact vias 202 are filled with a conductive material to produce contact plugs 210. Contact plugs 210 may comprise, similar to the composition of source/drain plugs 190, tungsten, copper, aluminum, or other suitable conductive material. Preferably, the formation of contact plugs 210 includes deposition process in which the conductive material is deposited into the contact vias 202 and, thereafter, a planarization process such as a chemical mechanical polish or other suitable planarization process to remove portions of the deposited conductive material from regions exterior to the contact vias 202 and to produce a substantially planar upper surface 211 suitable for receiving a subsequent interconnect level as will be appreciated to those skilled in the field of semiconductor processing. Using the described techniques, the source/drain interconnects are effectively removed from the semiconductor substrate and replaced with source/drain interconnects fabricated with the conductive material preferably less resistive than the source/drain regions within semiconductor substrate 102 possibly facilitating a reduction in the line widths of source/drain interconnects and permitting a corresponding increase in circuit density.

It will be appreciated to those skilled in the art that the present invention contemplates a discontinuous source/drain region formed within the semiconductor substrate to facilitate an increase in the density of the integrated circuit. It is understood that the form of the invention shown and described in the detailed description and the drawings are to be taken merely as presently preferred examples of how nitrogen can be incorporated into the gate dielectric and the conductive gate of an MOS transistor. It is intended that the following claims be interpreted broadly to embrace all the variations of the preferred embodiments disclosed.

What is claimed is:

1. A semiconductor process comprising;

forming a gate dielectric on a semiconductor substrate;

forming first and second conductive gates on said gate dielectric layer, wherein said conductive gates are aligned over respective channel regions of said semiconductor substrate, and wherein said channel regions are laterally displaced between respective pairs of source/drain regions;

depositing a first interlevel dielectric on said semiconductor substrate; and forming source/drain vias in said interlevel dielectric, wherein said source/drain vias terminate on said pairs of source/drain regions and, thereafter, introducing a source/drain impurity into said source/drain regions to form source/drain structures, wherein a conductivity type of said source/drain structures is opposite a conductivity type of said field region, and wherein said first interlevel dielectric substantially prevents said source/drain impurity from entering a portion of said semiconductor substrate intermediate between a source/drain region of said first conductive gate and an adjacent source/drain region of said second conductive gate thereby isolating said adjacent source/drain structures from one another.

2. The process of claim 1, further comprising forming spacer structures and sidewalls of said conductive gates.

3. The process of claim 2, wherein said spacer structures comprise silicon nitride.

4. The process of claim 1, further comprising filling said source/drain vias with a conductive material and planarizing said conductive material to form via plugs.

5. The process of claim 4, further comprising:

depositing a second interlevel dielectric and, thereafter, etching contact vias in said second interlevel dielectric wherein said contact vias terminate on said source/drain plugs and said conductive gates; and filling said contact vias with a conductive material and, thereafter, planarizing said conductive material to form contacts suitable for coupling said conductive gates and said source/drain structures to a interconnect layer.

6. The process of claim 1, wherein the step of forming said gate dielectric comprises oxidizing said semiconductor substrate in an oxygen bearing ambient maintained at a temperature in the range of approximately 400 to 800° C. for a duration in the range of approximately 2 to 20 minutes.

7. The process of claim 1, wherein the step of forming said first and second conductive gates comprises thermally decomposing silane in a CVD reactor chamber maintained at a temperature in the range of approximately 580 to 650° C.

and a pressure of less than approximately 2 torrs to deposit a polysilicon layer and, thereafter, patterning said polysilicon layer.

8. The process of claim 1, wherein the step of depositing said first interlevel dielectric comprises chemically vapor depositing a silicon-oxide compound at a temperature in the range of approximately 200 to 750° C. using a source comprising silane and oxygen or TEOS.

9. The process of claim 1, wherein the step of introducing said source/drain impurity into said source/drain regions comprises an ion implantation process with an implant species selected from the group comprising boron, arsenic, and phosphorous using an implant dose is in excess of approximately $1 \times 10^{14}$ atoms/cm$^2$ and an implant energy in the range of approximately 20 to 200 keV.

10. In a semiconductor fabrication process, a method of isolating adjacent source/drain structures of neighboring transistors, said method comprising:

forming a gate dielectric on a semiconductor substrate;

forming first and second conductive gates on said gate dielectric layer, wherein said conductive gates are aligned over respective channel regions of said semiconductor substrate, and wherein said channel regions are laterally displaced between respective pairs of source/drain regions, and wherein a field region of said semiconductor substrate is displaced between a source/drain region of said first conductive gate and an adjacent source/drain region of said second conductive gate wherein said field region consists essentially of doped silicon;

depositing a first interlevel dielectric on said semiconductor substrate; and forming source/drain vias in said interlevel dielectric, wherein said source/drain vias terminate on said pairs of source/drain regions and, thereafter, introducing a source/drain impurity into said source/drain regions to form pairs of source/drain structures, wherein a conductivity type of said pairs of source/drain structures is opposite a conductivity type of said field region whereby said source/drain structure of said first conductive gate is isolated from an adjacent source/drain region of said second conductive gate.

11. The process of claim 10, wherein a resistivity of said doped silicon within said field region is in the range of approximately 10 to 25 Ω-cm.

12. The process of claim 10, further comprising forming spacer structures or sidewalls of said conductive gates.

13. The process of claim 10, wherein the step of depositing said first interlevel dielectric comprises chemically vapor depositing a silicon-oxide compound at a temperature in the range of approximately 200 to 750° C. using a source comprising silane and oxygen or TEOS.

* * * * *